United States Patent
You et al.

(10) Patent No.: US 11,689,103 B2
(45) Date of Patent: Jun. 27, 2023

(54) POWER SUPPLY MONITORING AND SWITCHING FREQUENCY CONTROL

(71) Applicant: Infineon Technologies Austria AG, Villach (AT)

(72) Inventors: Zhiqing You, Torrance, CA (US); Tim Ng, Monterey Park, CA (US)

(73) Assignee: Infineon Technologies Austria AG, Villach (AT)

(*) Notice: Subject to any disclaimer, the term of this patent is extended or adjusted under 35 U.S.C. 154(b) by 55 days.

(21) Appl. No.: 17/212,371

(22) Filed: Mar. 25, 2021

(65) Prior Publication Data
US 2022/0311336 A1 Sep. 29, 2022

(51) Int. Cl.
| | |
|---|---|
| *H02M 3/158* | (2006.01) |
| *H02M 3/156* | (2006.01) |
| *G01R 19/165* | (2006.01) |
| *H03K 5/24* | (2006.01) |
| *H02M 1/00* | (2006.01) |

(52) U.S. Cl.
CPC ...... *H02M 3/158* (2013.01); *G01R 19/16538* (2013.01); *H02M 3/1566* (2021.05); *H03K 5/24* (2013.01); *H02M 1/0009* (2021.05); *H02M 1/0025* (2021.05)

(58) Field of Classification Search
CPC .. H02M 1/0032; H02M 3/1566; H02M 3/158; H02M 3/1588; H02M 3/156; H02M 3/157
See application file for complete search history.

(56) References Cited

U.S. PATENT DOCUMENTS

| | | | |
|---|---|---|---|
| 6,294,904 B1 * | 9/2001 | Hirst | G05F 1/44 323/283 |
| 7,764,526 B1 | 7/2010 | Xing et al. | |
| 9,166,471 B1 | 10/2015 | Levesque et al. | |
| 10,389,248 B1 * | 8/2019 | Park | H02M 3/158 |
| 2007/0290894 A1 | 12/2007 | Ng et al. | |

(Continued)

FOREIGN PATENT DOCUMENTS

| | | |
|---|---|---|
| CN | 101150285 A | 3/2008 |
| CN | 102832817 A | 12/2012 |
| JP | 2005333726 A | 12/2005 |

OTHER PUBLICATIONS

Extended Search Report, EP 22 16 4009, dated Aug. 8, 2022, pp. 1-10.

*Primary Examiner* — Alex Torres-Rivera
(74) *Attorney, Agent, or Firm* — Armis IP Law, LLC

(57) ABSTRACT

An apparatus such as a power supply circuit includes an input, a signal generator, and a frequency selector. The input receives a signal indicating a magnitude of current supplied by an output voltage of a voltage converter to power a load. The signal generator produces a frequency selection signal based on the magnitude of the current supplied to the load as indicated by the received signal. Via the frequency selection signal, the frequency selector selects a switching frequency of controlling switches in the voltage converter to produce the output voltage. According to one configuration, the signal generator and frequency selector delay increasing the switching frequency from a first switching frequency setting to a second switching frequency setting subsequent to detecting a change in the magnitude of the current.

35 Claims, 8 Drawing Sheets

(56) References Cited

U.S. PATENT DOCUMENTS

| | | | |
|---|---|---|---|
| 2008/0061759 A1* | 3/2008 | Lin | H02M 3/157 |
| | | | 323/290 |
| 2008/0180078 A1 | 7/2008 | Hiasa | |
| 2009/0174440 A1* | 7/2009 | Man | H02M 3/156 |
| | | | 327/114 |
| 2010/0134079 A1 | 6/2010 | Liu et al. | |
| 2011/0075458 A1 | 3/2011 | Phadke et al. | |
| 2012/0300508 A1 | 11/2012 | Fang et al. | |
| 2013/0033905 A1* | 2/2013 | Lin | H02M 3/33507 |
| | | | 363/21.13 |
| 2015/0062981 A1 | 3/2015 | Fang et al. | |
| 2017/0133929 A1* | 5/2017 | Matsuki | H02M 1/32 |
| 2018/0301995 A1 | 10/2018 | Chang | |
| 2018/0375429 A1* | 12/2018 | Trichy | H02M 3/158 |
| 2020/0076300 A1* | 3/2020 | Chiu | H02M 3/156 |
| 2021/0143739 A1* | 5/2021 | Liu | G01R 19/16528 |
| 2021/0194365 A1* | 6/2021 | Nam | H02M 3/158 |

\* cited by examiner

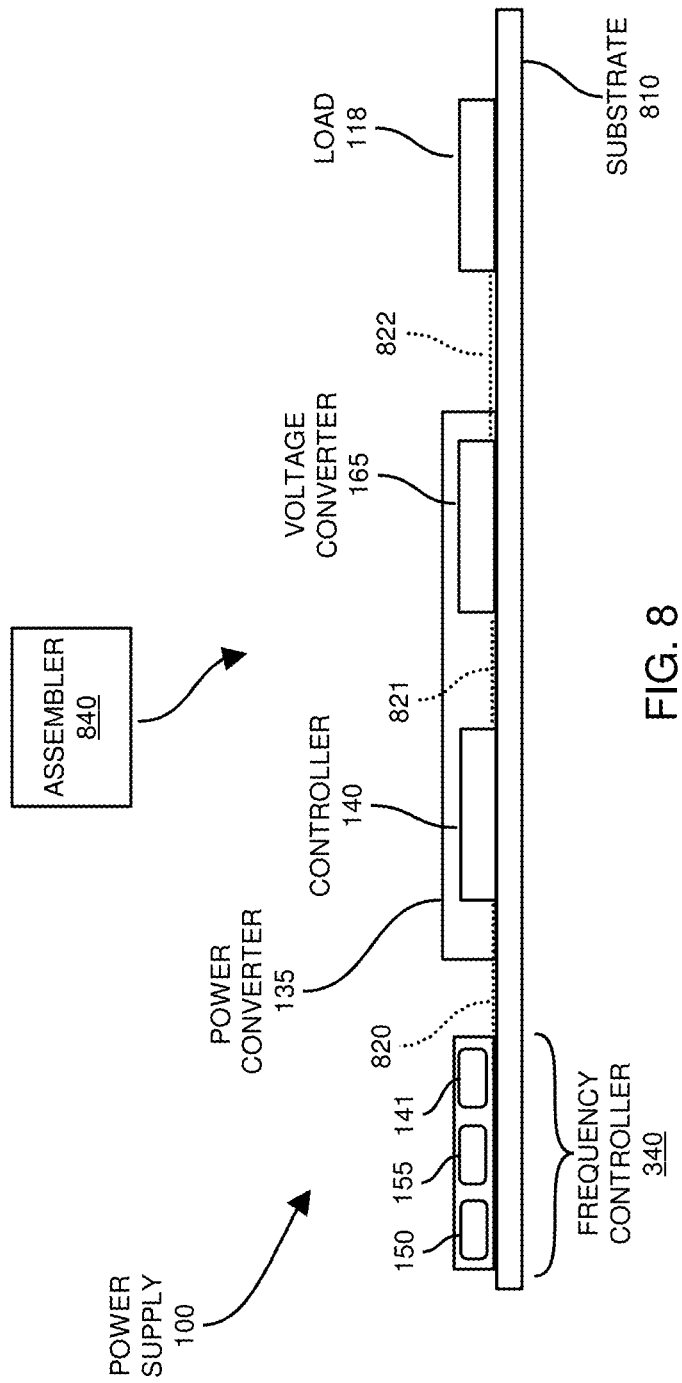

POWER SUPPLY MONITORING AND SWITCHING FREQUENCY CONTROL

BACKGROUND

One type of conventional power converter is a buck converter. In general, to maintain an output voltage within a desired range, a controller in the buck converter compares the magnitude of a generated output voltage to a setpoint reference voltage. Based on a respective error voltage, the controller modifies a respective switching frequency and/or pulse width modulation associated with activating high side switch circuitry and low side switch circuitry in the buck converter.

In certain instances, the controller controls operation of the buck converter and generation of the output voltage based on an amount of output current supplied by a generated output voltage to a load. For example, conventional techniques include receiving a so-called VID (Voltage Identification) from a load such as a processor being powered by the output voltage. The VID indicates a setpoint voltage in which to produce the output voltage to power the load. The controller of the power supply regulates a magnitude of the output voltage supplied to the load based on a target setpoint voltage derived from the received VID value.

To prevent saturating a power supply inductor with too much current or to avoid occurrence of a power stage avalanche condition, a voltage regulator (VR) controller can be configured to limit the peak current through the power supply inductor by truncating a pulse width of a PWM signal used to control switches producing the output voltage. However, due to PWM pulse truncation, the corresponding generated output voltage (such as Vout) may fall below a minimum threshold level in which a respective load is no longer operable.

One conventional way to maintain the output voltage above a minimum threshold level is to: i) implement an inductor with higher saturation current, ii) implement power stages with higher VDS capability, and/or iii) increase total output capacitors of the power supply. The downside to such implementations is that: i) the inductor with higher saturation current (such as lower inductance value) introduces higher ripple current or requires higher switching frequency of operation resulting in lower voltage conversion efficiency, ii) a power stage with high VDS capability is more expensive, especially if a same Rdson is to be maintained, and iii) the addition of more output capacitors increases size of the power supply and corresponding cost of same.

BRIEF DESCRIPTION

Implementation of clean energy (or green technology) is very important to reduce our human impact on the environment. In general, clean energy includes any evolving methods and materials to reduce an overall toxicity on the environment from energy consumption.

This disclosure includes the observation that raw energy, such as received from green energy sources or non-green energy sources, typically needs to be converted into an appropriate form (such as desired AC voltage, DC voltage, etc.) before it can be used to power end devices such as servers, computers, mobile communication devices, wireless base stations, etc. In certain instances, energy is stored in a respective one or more battery resource. Alternatively, energy is received from a voltage generator or voltage source.

Regardless of whether energy is received from green energy sources or non-green energy sources, it is desirable to make most efficient use of raw energy (such as storage and subsequent distribution) provided by such sources to reduce our impact on the environment. This disclosure contributes to reducing our carbon footprint and providing better use of energy via more efficient energy conversion.

This disclosure further includes the observation that power conversion efficiency of conventional power supplies can be improved. For example, to this end, embodiments herein include novel ways of providing improved performance of power conversion via implementation of switching frequency control.

Embodiments herein include novel ways of controlling a switching frequency used to produce an output voltage via a power supply.

More specifically, embodiments herein include an apparatus such as a power supply and frequency controller including an input, a signal generator, and a frequency selector. The input receives a current measurement signal indicating a magnitude of current supplied by an output voltage of a voltage converter to power a load. The signal generator produces a frequency selection signal based on the magnitude of the current supplied to the load as indicated by the received signal. Via the frequency selection signal, the frequency selector selects a switching frequency of controlling switches in the voltage converter to produce the output voltage.

Further example embodiments of the power supply as discussed herein include a switch controller. The switch controller controls switching of the switches to convert an input voltage into the output voltage based on the selected switching frequency.

During operation, the frequency selector controls switching of the switching frequency from a first switching frequency to a second switching frequency. In one embodiment, the frequency selector delays increasing the switching frequency from a first switching frequency setting to a second switching frequency setting subsequent to detecting a change in the magnitude of the current or output voltage. In such an embodiment, the magnitude of the output voltage changes by a sufficient amount that a detector monitoring the output voltage detects the change in magnitude of the output voltage.

As further discussed herein, switching operation of the power supply and switch control from the first switching frequency to the second switching frequency prevents the output voltage from dropping a minimum threshold level required to power the dynamic load. Thus, the changeover to the second switching frequency (such as a higher frequency) prevents the dynamic load from being reset due to a low power condition.

In further example embodiments, the signal generator includes a comparator that compares the signal (indicating the magnitude of inductor current delivered to the dynamic load) to a peak current threshold value (current limit value). In one embodiment, the switch controller adjusts states of controlling the switches in the voltage converter in response to detecting that the signal equals the peak current threshold value. More specifically, the frequency selector increases the switching frequency of controlling the switches in the voltage converter in response to detecting that the magnitude of the inductor current equals the peak current threshold value for multiple control cycles (such as a selected number of control cycles/periods) of controlling the switches.

In further example embodiments, the frequency selector increases the switching frequency of controlling the switches in the voltage converter in response to a detected condition in which the magnitude of the inductor current equals a current limit value for a predetermined number of control cycles of controlling the switches.

In further example embodiments, the frequency selector sets the switching frequency of the voltage converter to a first frequency setting prior to detecting a change in the magnitude of the current; the frequency selector delays adjustment of the switching frequency to a second frequency setting after detecting the change in the magnitude of the current or output voltage. A magnitude of the output voltage changes at a first rate during the delay window; the magnitude of the output voltage changes at a second rate in response to selection of the second switching frequency. In other words, the magnitude of the output voltage changes at a second rate when controlling operation of the switches via the second switching frequency.

Yet further example embodiments herein include, via the frequency selector, setting the switching frequency to a first setting prior to detecting a change in the magnitude of the current; and setting the switching frequency to the first setting in a first window of time between a first time instant of detecting the change in the magnitude of the current and second time instant of detecting a trigger event. In one embodiment, the trigger event is a condition in which the magnitude of the current is equal to a peak current limit value for multiple control cycles of monitoring the magnitude of current in the first window of time. The frequency selector sets the switching frequency to a second setting in a second window of time subsequent to the first window of time, the second switching frequency being greater than the first switching frequency.

These and other more specific embodiments are disclosed in more detail below.

Note that although embodiments as discussed herein are applicable to power converters, the concepts disclosed herein may be advantageously applied to any other suitable topologies as well as general power supply control applications.

Note that any of the resources as discussed herein can include one or more computerized devices, mobile communication devices, servers, base stations, wireless communication equipment, communication management systems, workstations, user equipment, handheld or laptop computers, or the like to carry out and/or support any or all of the method operations disclosed herein. In other words, one or more computerized devices or processors can be programmed and/or configured to operate as explained herein to carry out the different embodiments as described herein.

Yet other embodiments herein include software programs to perform the steps and operations summarized above and disclosed in detail below. One such embodiment comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, embodiments herein are directed to methods, systems, computer program products, etc., that support operations as discussed herein.

One embodiment herein includes a computer readable storage medium and/or system having instructions stored thereon. The instructions, when executed by computer processor hardware, cause the computer processor hardware (such as one or more co-located or disparately located processor devices) to: receive a signal indicating a magnitude of current supplied by an output voltage generated by a voltage converter to power a load; produce a frequency selection signal based on the magnitude of the current supplied to the load as indicated by the received signal; and via the frequency selection signal, select a switching frequency of controlling switches in the voltage converter to produce the output voltage.

The ordering of the steps above has been added for clarity sake. Note that any of the processing steps as discussed herein can be performed in any suitable order.

Other embodiments of the present disclosure include software programs and/or respective hardware to perform any of the method embodiment steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

As discussed herein, techniques herein are well suited for use in the field of implementing one or more voltage converters to deliver current to a load. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein (BRIEF DESCRIPTION OF EMBODIMENTS) purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention (s), the reader is directed to the Detailed Description section (which is a further summary of embodiments) and corresponding figures of the present disclosure as further discussed below.

BRIEF DESCRIPTION OF THE DRAWINGS

FIG. 8 is an example diagram illustrating assembly of a circuit according to embodiments herein.

Figure 1:
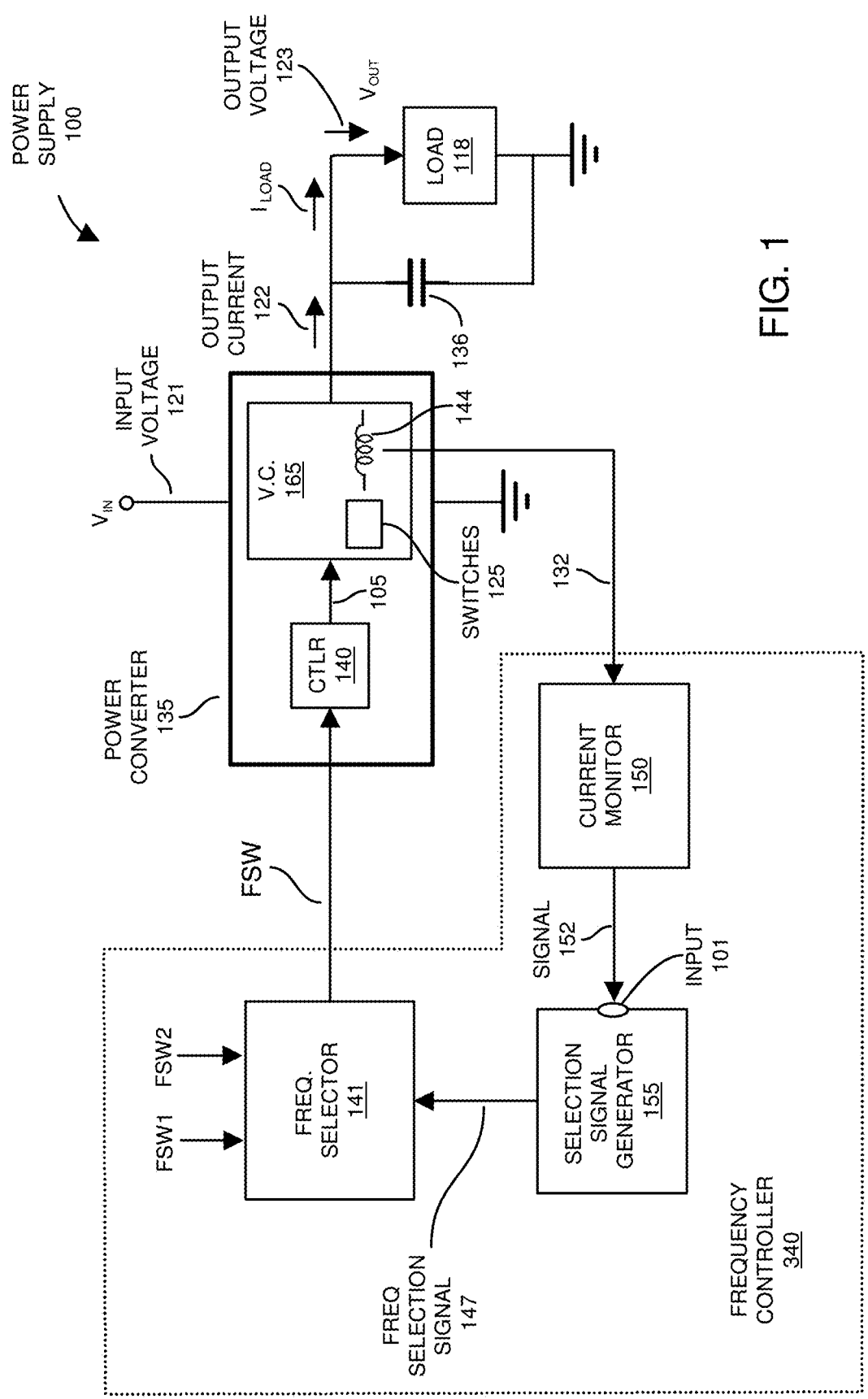
FIG. 1 is an example general diagram of a power supply supplying current through an inductance of a switched power supply to a dynamic load according to embodiments herein.

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

Embodiments herein include an apparatus to control a frequency of operating switches in a voltage converter to generate an output voltage. In one embodiment, the apparatus includes a signal generator and a frequency selector. An input of the signal generator receives a signal from a current monitor. The signal from the current monitor indicates a magnitude of current supplied by an output voltage of the voltage converter to power a load. The signal generator produces a frequency selection signal based on the magnitude of the current supplied to the load as indicated by the received signal. Via the frequency selection signal, the frequency selector selects a switching frequency of controlling switches in the voltage converter to produce the output voltage.

According to one configuration, the signal generator and frequency selector delay increasing the switching frequency from a first switching frequency setting to a second switching frequency setting around a time in which a change in the magnitude of the output current or output voltage occurs. The delay as discussed herein provides sufficient time for other circuitry such as the load or other suitable entity monitoring the output voltage or current to detect a corresponding transient condition in which the output voltage drops due to increased current consumption.

In further non-limiting example embodiments, the load powered by the output voltage controls a magnitude of the output voltage and the current consumption of the load. In one embodiment, detection of the transient load condition (such as drop in a magnitude of the output voltage) causes the load to internally reduce its power consumption.

Now, more specifically, FIG. 1 is an example general diagram of a power supply and corresponding components according to embodiments herein.

In this example embodiment, the power supply 100 includes power converter 135, current monitor 150, selection signal generator 155, and frequency selector 141.

Power converter 135 includes controller 140 and voltage converter 165. Voltage converter 165 includes switches 125 and one or more inductive devices 144. During operation, via control of switches 125, the voltage converter 165 converts the input voltage 121 into the output voltage 123. The output voltage 123 and corresponding generated output current 122 (i.e., $I_{LOAD}$) supply power to the load 118.

As further shown, current monitor 150 receives one or more signals such as feedback signals 132 associated with the voltage converter 165. Via the one or more signals 132, in one embodiment, the output current measurement 150 physically measures or estimates the output current 122 supplied through the inductor 144 to the combination of capacitor 136 and the dynamic load 118.

Based on the feedback signals 132, the current monitor 150 produces current sense signal 152 (i.e., inductor output current information) indicating a magnitude of the output current 122 supplied by the input voltage 123 through the inductor 144 to the load and capacitors 136.

Note that the current monitor 150 (such as output current measurement resource) includes any suitable circuitry to monitor an amount of current through the inductor 144. For example, in one embodiment, the current monitor 150 is or includes one or more analog-to-digital converters to measure a voltage across a resistive element (such as resistive element inherent in the inductor 144 itself or a separate component) in the power converter through which the inductor output current 122 flows.

As a further non-limiting example embodiment, the current monitor can be configured to include one or more analog-to-digital converters and/or corresponding circuitry that produces the actual sample measurements of the output current 122. This can include a technique such as measuring the voltage across the inductor 144 of the corresponding voltage converter 165 and implementing so-called DCR measurements to detect the output current 122.

Alternatively, as mentioned, embodiments herein include monitoring a voltage of a resistive element such as an $R_{DSON}$ (resistance of high side switch circuitry and/or low side switch circuitry between the drain and source nodes) through which the output current 122 flows when the low side switch circuitry is ON.

Yet further embodiments include determining a magnitude of the output current 122 via current mirroring techniques.

Thus, any suitable type of physical measurements can be implemented to detect a magnitude or change in magnitude of the output current 122 through the inductor 144.

Current monitor 150 supplies signal 152 (indicating a magnitude of the output current 122 through the inductor 144) to the input 101 of the selection signal generator 155. Thus, via the input 101, the selection signal generator 155 receives a current measurement signal 152 indicating a magnitude of output current 122 supplied by the output voltage 123 of the voltage converter 165 to power the dynamic load 118.

As further shown, the signal generator 155 produces a frequency selection signal 147 based on the magnitude of the current 122 supplied to the load 118 as indicated by the received signal 152. Via the frequency selection signal 147 (i.e., a control signal), the frequency selector 141 selects an appropriate switching frequency FSW of controlling switches 125 in the voltage converter 165 to produce the output voltage 123.

As further shown, the power supply 100 as discussed herein includes a switch controller 140. The switch controller 140 controls switching of the switches 125 to convert the input voltage into the output voltage 123 based on the selected switching frequency FSW.

Figure 2:
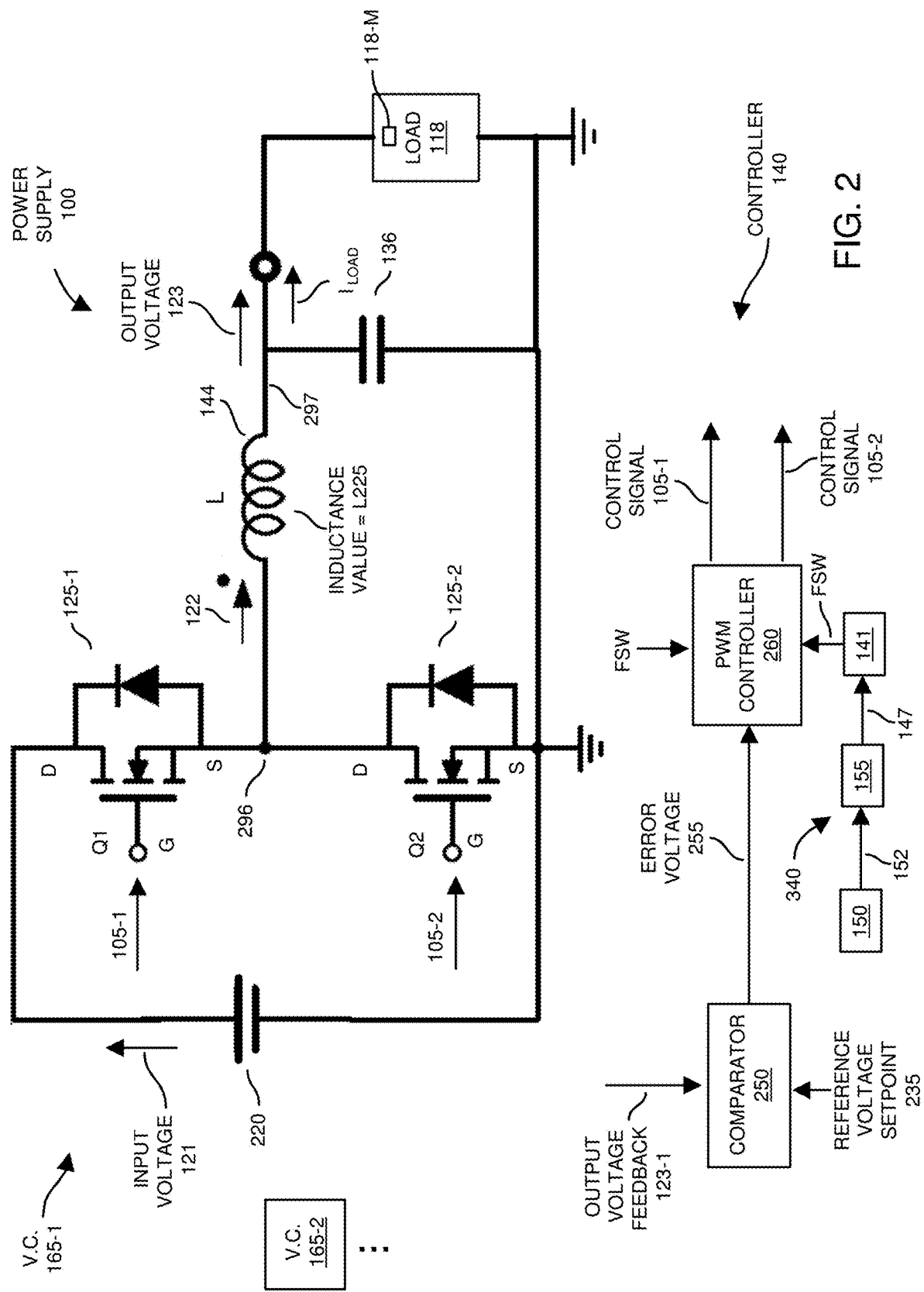
FIG. 2 is an example diagram illustrating operation of a power converter at a selected signal generator frequency and generation of an output voltage according to embodiments herein.

A more detailed non-limiting example embodiment of implementing and controlling switches 125 in a power supply 100 is shown in FIG. 2.

FIG. 2 is an example diagram illustrating operation of a power converter at a selected signal generator frequency and generation of an output voltage according to embodiments herein.

In this non-limiting example embodiment, the voltage converter 165-1 is configured as a buck converter including voltage source 220 (providing input voltage 121), switch Q1, switch Q2, inductor 144, and output capacitor 136 (such as one or more capacitors).

Note that the power supply 100 includes any number of voltage converters 165 (such as voltage converter 165-1, voltage converter 165-2, etc.) disposed in parallel to produce the output voltage 123. Each voltage converter such as voltage converter 165-2 operates in a similar manner as voltage converter 165-1.

Although the voltage converter 165-1 in FIG. 2 is shown as a buck converter configuration, note again that the voltage converter 165 can be instantiated as any suitable type of voltage converter and include any number of phases, providing regulation of a respective output voltage 123 as described herein.

As further shown in this example embodiment, the switch Q1 of voltage converter 165-1 is connected in series with switch Q2 between the input voltage 121 and corresponding ground reference.

For example, the drain node (D) of the switch Q1 is connected to the voltage source 220 to receive input voltage 121. The switch controller 140 drives the gate node (G) of switch Q1 with control signal 105-1.

The source node (S) of the switch Q1 is connected to the drain node (D) of the switch Q2 at node 296. The switch controller 140 drives the gate node (G) of switch Q2 with control signal 105-2. The source node (S) of the switch Q2 is connected to ground.

As previously discussed, the voltage converter 165 further includes inductor 144. Inductor 144 extends from the node 296 to the output capacitor 136 and dynamic load 118.

Via switching of the switches Q1 and Q2 via respective control signal 105-1 (applied to gate G of switch Q1) and control signal 105-2 (applied to gate G of switch Q2), the node 296 coupling the source (S) node of switch Q1 and the drain (D) node of switch Q2 provides output current 122 through the inductor 144, resulting in generation of the output voltage 123 and corresponding output current $I_{LOAD}$ powering the load 118 and energizing capacitors 136.

In general, the magnitude of the current $I_{LOAD}$ is equal to a magnitude of the output current 122 through inductor 144.

In one embodiment, the controller 140 controls switching of the switches Q1 and Q2 based on one or more feedback parameters. For example, the controller 140 can be configured to receive output voltage feedback signal 123-1 derived from the output voltage 123 supplied to power the load 118 as previously discussed in FIG. 1. The output voltage feedback signal 123-1 can be the output voltage 123 itself or a proportional derivative value thereof using a resistor divider.

Referring again to FIG. 2, via the comparator 250, the controller 140 compares the output voltage feedback signal 123-1 (such as output voltage 123 itself or derivative, or proportional signal) to the reference voltage setpoint 235.

As previously discussed, the reference voltage 235 is a desired setpoint in which to control a magnitude of the output voltage 123 during load-line regulation implemented by the power supply 100. Also, as previously discussed, during load-line regulation, a magnitude of the reference voltage 235 may vary depending on the magnitude of the inductor output current 122.

In one embodiment, the monitor 118-M in or associated with the dynamic load 118 provides feedback indicating a desired setpoint 235. Additionally, or alternatively, the reference voltage 235 may be a static value.

In further example embodiments, the comparator 250 produces a respective error voltage 255 based on the difference between the output voltage feedback signal 123-1 and the reference voltage 235. A magnitude of the error voltage 255 generated by the comparator 250 varies depending upon the degree to which the magnitude of the output voltage 123 is in or out of regulation (with respect to the reference voltage setpoint 235).

As further shown, the PWM (Pulse Width Modulation) controller 260 of the controller 140 controls operation of switching the switches Q1 and Q2 based upon the magnitude of the error voltage 255. For example, if the error voltage 255 indicates that the output voltage 123 (of the voltage converter 165-1) becomes less than a magnitude of the reference voltage setpoint 235, the PWM controller 260 increases a duty cycle or frequency of activating the high side switch Q1 (thus decreasing a duty cycle of activating the low-side switch Q2) in a respective switch control cycle.

Conversely, if the error voltage 255 indicates that the output voltage 123 (of the voltage converter 165-1) becomes greater than a magnitude of the reference voltage setpoint 235, the PWM controller 260 decreases a duty cycle or frequency of activating the high side switch Q1 (thus increasing a duty cycle of activating the low-side switch Q2) in a respective switching control cycle.

As is known in the art, the controller 140 controls each of the switches Q1 and Q2 ON and OFF at different times to prevent short-circuiting of the input voltage 121 to the ground reference voltage. For example, for a first portion of the control cycle, when the switch Q1 is activated to an ON state, the switch Q2 is deactivated to an OFF state. Conversely, when the switch Q1 is deactivated to an OFF state, the switch Q2 is activated to an ON state.

Note that the controller 140 (via PWM controller 260) implements a dead time (both switches Q1 and Q2 OFF) between state ON-OFF and OFF-ON state transitions to prevent shorting of the input voltage 121 to the ground reference.

Via variations in the pulse with modulation (and/or frequency modulation) of controlling the respective switches Q1 and Q2, the controller 140 controls generation of the output voltage 123 such that the output voltage 123 remains within a desired voltage range with respect to the reference voltage setpoint 235.

The following drawings illustrate implementation of different control signals and a magnitude of the inductor output current 122 over time.

For example, the pulse width modulation controller 260 produces control signals 105 (control signal 105-1 and control signal 105-2) using switching frequency FSW supplied by the frequency selector 141. As previously discussed, the monitor 150 determines a magnitude of output current 122 through inductor 144 and produces the signal 152 indicating the magnitude. As its name suggests, selection signal generator 155 selects amongst one or more frequencies in which to supply to the controller 140.

The magnitude of current 122 through the inductor 144 increases when the high-side switch Q1 (such as one or more field effect transistor or other suitable component) is ON and low-side switch Q2 (such as one or more field effect transistor or other suitable component) is OFF; the magnitude of current 122 through the inductor 144 decreases when the high-side switch Q1 is OFF and Q2 is ON.

Figure 3:
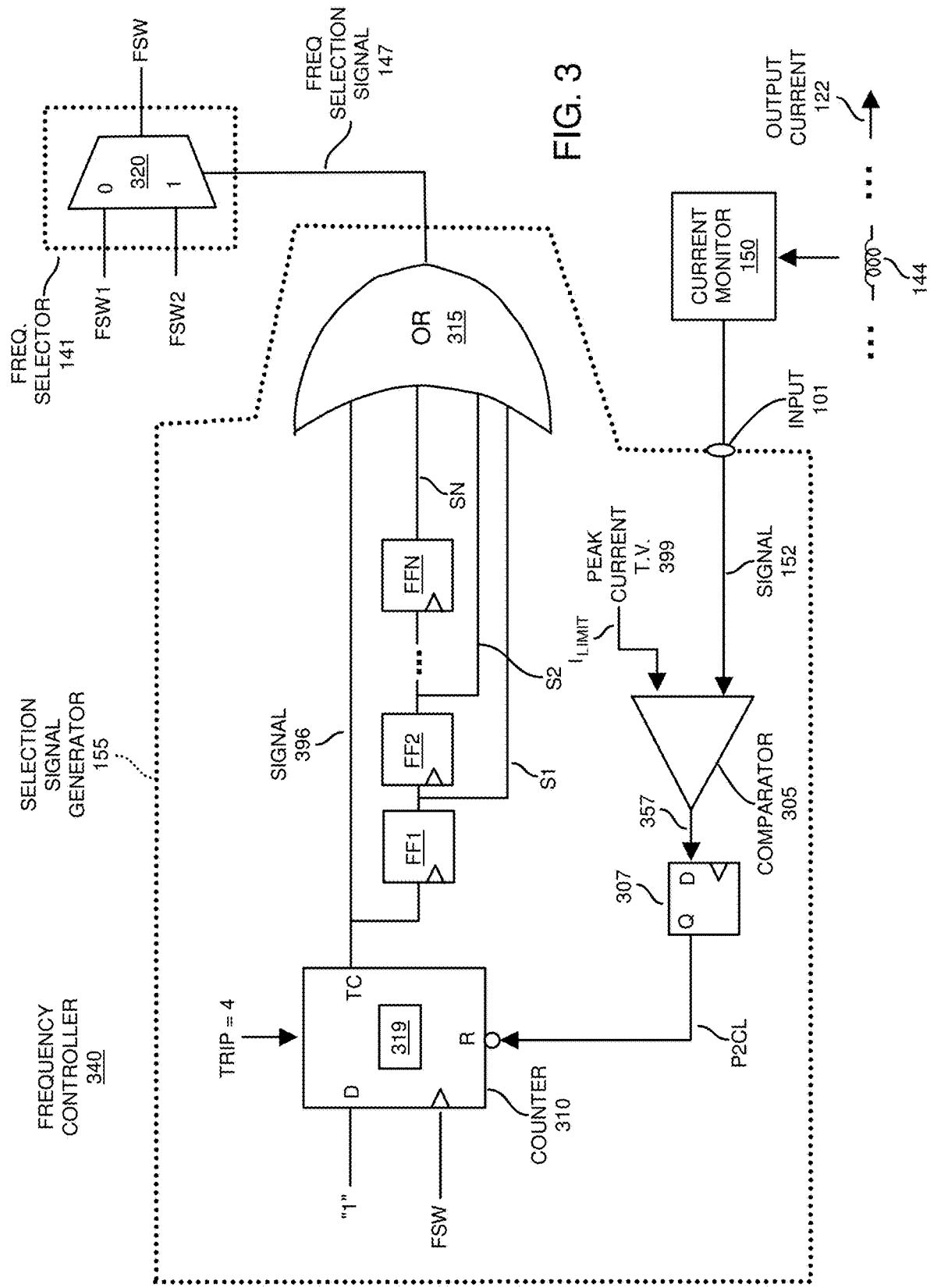
FIG. 3 is an example diagram illustrating frequency selection and frequency control according to embodiments herein.

FIG. 3 is an example diagram illustrating frequency selection according to embodiments herein.

In this example embodiment, frequency controller 340 includes signal generator 155 and frequency selector 141. The frequency selection signal generator 155 includes input 101, comparator 305, flip flop 307, counter 310, flip-flops FF1, FF2, . . . , FFN, and gate logic 315 (such as an OR gate). The selection signal generator 315 can include any number of flip flops to store and delay signal 396.

Frequency selector 141 includes multiplexer 320.

As previously discussed, the current monitor 150 monitors a respective output current 122 delivered by the inductor 144 to the load 118. Current monitor 150 produces the signal 152 indicating a magnitude of the output current 122 and inputs it to the input 101 of the selection signal generator 155.

The selection signal generator 155 implements comparator 305 to determine when the magnitude of the output current 122 through the inductor 144 equals or exceeds a respective peak current threshold value 399 (such as maximum current limit value). The comparator 305 outputs signal 357 indicating whether the magnitude of the output current 122 equals or exceeds the peak current threshold value 399. Flip-flop 307 is clocked via the switching frequency FSW (or other suitable frequency) and stores the value of signal 357 for each respective cycle indicating whether the magnitude of the output current 122 was equal to or greater than the peak current threshold value 399 at any time during the prior corresponding control cycle.

The flip-flop 307 outputs signal P2CL (logic high indicates that the output current 122 raises to the peak current limit 399) to counter 310.

In one embodiment, as further discussed herein, detection of the output current 122 greater than or equal to the peak current threshold value 399 causes the controller 140 to discontinue activating the high side switch circuitry Q1 (in FIG. 2). This prevents overshoot of the magnitude of the output current 122 above the peak current threshold value 399.

Further, in this example embodiment, as previously discussed, the flip-flop 307 stores signal P2CL in which a respective logic low (resetting the counter 310) indicates that the magnitude of current 122 through the inductor 144 is below a threshold value. Conversely, the stored signal P2CL is a logic high during conditions in which the signal 152 is greater than the peak current threshold value 399.

The count value 319 in counter 310 increments by one each period of the switching frequency FSW in which the magnitude of the output current 122 is greater than the peak current threshold value 399. If the signal P2CL goes low, the counter 310 is reset.

In one embodiment, the output signal 396 of the counter 310 (such as signal TC) is logic low until the count value 319 equals setpoint trip value=4 or more. When the signal 396 goes logic high, the output signal 147 of the gate logic 315 switches to a logic high as well. The output signal 147 controls mux 320, causing the switching frequency FSW to be set to FSW2 instead of switching frequency FSW1.

In one embodiment, the programmer of the power supply 100 sets two or more switching frequencies. For example, the programmer sets the switching frequency FSW1 as a base switching frequency and switching frequency FSW2 (higher switching frequency) as an auxiliary switching frequency to operate the controller 140 when it is detected that the output current 122 through the inductor 144 reaches the current limit such as peak current threshold value 399 multiple times.

String of delay flip-flops FF1, FF2, . . . , FFN, receive signal 396 from the counter 310 and ensure that the output signal 147 of the logic gate 315 remains a logic high (ensuring continued selection of the switching frequency FSW2) for N periods of the switching frequency FSW after the signal P2CL goes logic low again. Thus, the switch FSW2 may still be selected even when the signal 396 goes low again.

As further discussed herein, the selection signal generator 155 increases a magnitude of the switching frequency FSW when inductor peak current 122 equals or exceeds the pulse to peak current threshold value 399 (such as pulse current limit threshold or P2CL) in response to detecting multiple cycles of reaching current limit for 4 (because trip=4, which is the count at which signal 396 goes high) switching periods at the switching frequency FSW1. For example, when signal 147 goes from logic low to a logic high, the mux 320 switches from selecting the switching frequency FSW1 to selecting switching frequency FSW2.

In such an instance, the increased switching frequency (FSW2) results in the inductor 144 delivering a higher overall magnitude of the output current 122 to charge the output capacitor 136 and power load 118. As a result of the increased switching frequency, the slew rate of the output voltage 123 decreases. In one embodiment, this allows the dynamic load 118 (such as a processor or CPU) to reduce its power consumption before the output voltage 123 falls below a minimum threshold level.

Thus, in one embodiment, the frequency selector 141 increases the switching frequency FSW of controlling the switches 125 in the voltage converter 165 in response to a detected condition in which the magnitude of the current 122 through inductor 144 equals a current limit value (such as peak current threshold value 399) for a predetermined number of control cycles (such as 4 or other suitable value) of controlling the switches 125.

Note that, because the switching frequency is increased, embodiments herein do not require a change to a size (inductance) of the inductor 144, power stage, or (capacitance of the) output capacitor 136 to prevent the drop of the output voltage below a minimum threshold value.

In one embodiment, the switching frequency FSW1 provides better (higher percentage of) conversion efficiency of converting the input voltage 121 into the output voltage 123 than the operating the switches 125 at the second switching frequency FSW2 to convert the input voltage 121 into the output voltage 123. However, as mentioned, operating the switches 125 at the second switching frequency FSW2 for a temporary window of time prevents the output voltage 123 from falling below a minimum threshold value.

Additional details of implementing the circuitry in FIG. 3 and frequency selection is discussed below.

Figure 4:
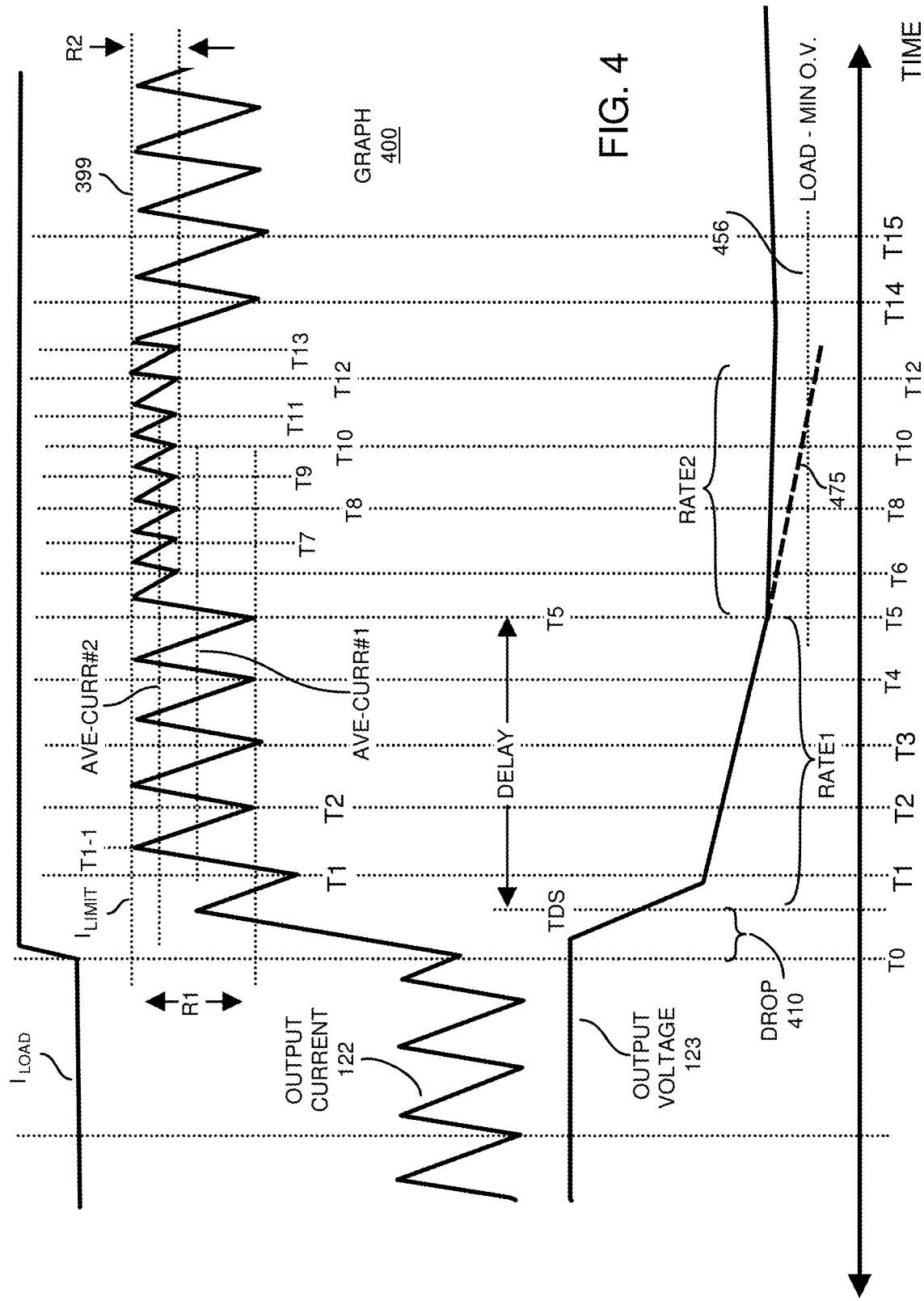
FIG. 4 is an example timing diagram illustrating frequency adjustment and corresponding output voltage control according to embodiments herein.

FIG. 4 is an example timing diagram illustrating frequency adjustment and corresponding output voltage control according to embodiments herein.

Output current 122 includes an amount of ripple R1 or R2 that varies depending on the selected switching frequency.

For example, the controller 140 activates high side switch circuitry 125-1 for a first portion of a control cycle between time T1 and time T1−1 when the output current 122 eventually reaches $I_{LIMIT}$. As shown, the magnitude of the output current 122 increases when switch 125-1 is activated ON.

The controller 140 deactivates the high-side switch 125-1 and activates low side switch circuitry 125-2 for a second portion of a control cycle between time T1–1 and time T2 during which a magnitude of the output current 122 decreases.

In this manner, the controller 140 produces the output current 122, including ripple current R1 when switching frequency FSW1 is selected. As discussed below, output current controller 140 produces the output current 122, including ripple current R2 when switching frequency FSW2 is selected.

In general, when output current 122 through inductor 144 reaches a magnitude as indicated by the peak current threshold value 399 for multiple switching cycles as programmed in the controller 310 such as a trip value of 4, the power supply 100 switches to switching frequency FSW2 until P2CL is not triggered for a number of delay switching frequency cycles applied signal 396 such as controlled by flip-flops FF1, FF2, . . . , FFN.

More specifically, during operation, the frequency selector 141 controls switching of the switching frequency FSW from a first switching frequency FSW1 to a second switching frequency FSW2. In one embodiment, the frequency selector 141 as discussed herein delays (delay time TDS to time T5) increasing the switching frequency FSW from the first switching frequency FSW1 setting to the second switching frequency FSW2 setting subsequent to detecting or simply experiencing a change in the magnitude of the output current 122. For example, the change in current $I_{LOAD}$ consumed by the load 118 increases and occurs at time T0. This causes a drop 410 in a magnitude of the output voltage 123. The monitor 150 detects a change (increase) in a magnitude of the output current 122 and/or drop of output voltage 123 at or around time T0 to T1. The frequency selector 141 does not immediately switch to operating at the higher switching frequency FSW2 at time T0 to time T1. Instead, the counter 310 in FIG. 3 requires the output current 122 to reach the current limit 399 for a predetermined number of counts at the first switching frequency FSW1 as measured by corresponding delay between time TDS and time T4. As further discussed below, the controller eventually switches to selection of the second switching frequency at around time T5.

In one embodiment, as previously discussed, the signal generator 155 includes a comparator 305 that compares the signal 152 (indicating the magnitude of inductor current 122 delivered to the dynamic load 118) to a peak current threshold value 399. The switch controller 140 adjusts states of controlling the switches 125 in the voltage converter 165 in response to detecting that the signal 152 equals the peak current threshold value 399 for multiple control cycles. More specifically, the frequency selector 141 increases the switching frequency FSW of controlling the switches 125 in the voltage converter in response to detecting that the magnitude of the inductor current 122 equals the peak current threshold value 399 for multiple control cycles of controlling the switches (when signal 396 goes logic high) at around time T5.

In such an embodiment, the magnitude of the output voltage 123 changes by a sufficient amount between time T0 and T4 that a detector 118-M (such as in or associated with the dynamic load 118) or other suitable entity monitoring the received output voltage 123 detects the change in magnitude of the output voltage 123 or output current 122. If desired, the detector or monitor 118-M in the dynamic load 118 may adjust operation of the dynamic load 118 to reduce current consumption by $I_{LOAD}$ to prevent an under-voltage condition below threshold value 456.

As further discussed herein, at the time of frequency switchover such as around time T5, the frequency selector 141 switches operation of the power supply 100 and switch control from the first switching frequency FSW1 to the second switching frequency FSW2, preventing the output voltage 123 from dropping below a minimum threshold level (such as LOAD—MINIMUM OUTPUT VOLTAGE 456) required to power the dynamic load 118. Thus, the changeover from the first switching frequency FSW1 to the second switching frequency FSW2 (such as FSW2 being a higher frequency than FSW1) at or around time T5 or T6 prevents the dynamic load 118 from being reset (shutting off) due to a low power condition below threshold voltage value 456. Extrapolation 475 of the output voltage 123 continuing to operate at switching frequency FSW1 indicates that the output voltage 123 would otherwise fall below the threshold value 456 without switchover to the second switching frequency FSW2.

As further shown, note that the magnitude of the output voltage 123 changes (reduces) at a first rate (RATE 1) during the delay between time TDS and time T4; the magnitude of the output voltage 123 changes at a second rate (RATE 2) in response to selection of the second switching frequency FSW2. In other words, the magnitude of the output voltage 123 changes at a second rate (RATE2) when controlling operation of the switches 125 via the second switching frequency FSW2.

Yet further example embodiments herein include, via the frequency selector 141, setting the switching frequency to a first setting FSW1 prior to occurrence of a change in the magnitude of the current 122 at around time T0; and continuing to set the switching frequency FSW to the first setting FSW1 in a first window of time (DELAY) between a first time instant (such as time TDS) of detecting or experiencing the change in the magnitude of the current 122 (and/or change in output voltage 123) and second time instant T5 of detecting a trigger event. In one embodiment, the trigger event of changing the switching frequency is a condition in which the magnitude of the output current 122 is equal to or repeatedly reaches the peak current limit value 399 for multiple control cycles (periods) of monitoring the magnitude of current in the first window of time between T1 and time T5. The frequency selector 141 sets the switching frequency FSW to a second setting FW2 in a at least a second window of time (such as between time T5 and time T13) subsequent to the first window of time (TDS to T5).

Note that operation at the higher switching FSW2 and supplying the output current 122 up to the peak output current limit (peak current threshold value 399) results in providing a higher amount of power to the dynamic load 118. For example, when the controller 140 controls the switches 125 at the first switching frequency FSW1 between time T1 and T5, the output current 122 repeatedly reaches the peak current threshold value 399 (current limit) and has an average current of AVE-CURR #1.

Operation at the higher switching frequency FSW2 results in an increased average output current 122 and prevent the magnitude of the output voltage 123 from dropping to low below a minimum threshold value. For example, when the controller 140 controls the switches 125 at the second switching frequency FSW2 between time T5 and T13, the output current 122 repeatedly reaches the peak current threshold value 399 (current limit) and has an average current of AVE-CURR #2. The average current AVE-CURR

2 is greater than the AVE-CURR #1, resulting in a higher level of power delivered by the output voltage 123 to the dynamic load 118 during the second window of time between time T5 and T13.

In one embodiment, the average current AVE-CURR #1=$I_{LIMIT}$−(R1/2), where R1 represents the magnitude of the ripple voltage associated with the output voltage 123 while operated at the first switching frequency FSW1 and $I_{LIMIT}$=peak current threshold value 399.

The average current AVE-CURR #2=$I_{LIMIT}$−(R2/2), where R2 represents the magnitude of the ripple voltage associated with the output voltage 123 while operated at the second switching frequency FSW2 and $I_{LIMIT}$=peak current threshold value 399.

Note again that the power converter as discussed herein can be implemented to include any number of phases (such as NPH) similar to the phase shown in FIG. 2. In such an instance, the extra current from each of the multiple phases is NPH*(R1−R2)/2, where NPH equals the total number of phases contributing respective inductor current to produce the output voltage 123.

Figure 5:
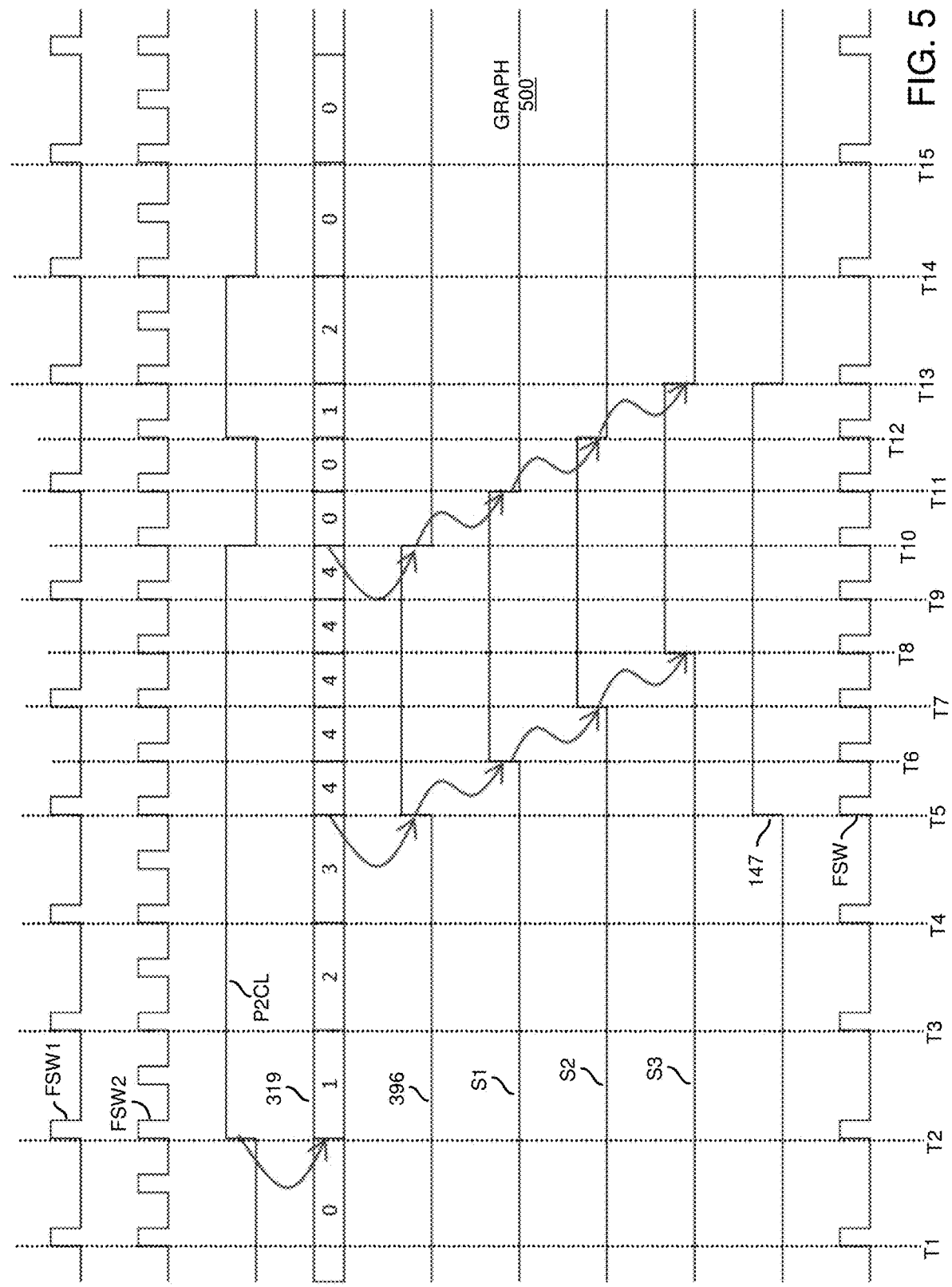
FIG. 5 is an example timing diagram illustrating implementation of frequency adjustment control according to embodiments herein.

FIG. 5 is an example timing diagram illustrating frequency adjustment control according to embodiments herein.

In this example embodiment as shown in graph 500, the different switching frequencies FSW1 and FSW2 are synchronized with each other. However, even though peak current is detected between time T2 and T5, and the output voltage 123 drops substantially, the switchover to the higher switching frequency is delayed in a manner as previously discussed.

For example, with further reference to FIG. 3 and FIG. 5, the output signal 396 does not go to a logic high (signal 147) until 4 counts of detecting the output current 122 reaching the current limit as indicated by the peak current threshold value 399. As shown by signals S1, S2, and S3 (where N=3, SN=S3), the flip-flops FF1, FF2, . . . , FFN, delay switching back to the first switching frequency FSW1 until time T13 and thereafter.

Figure 6:
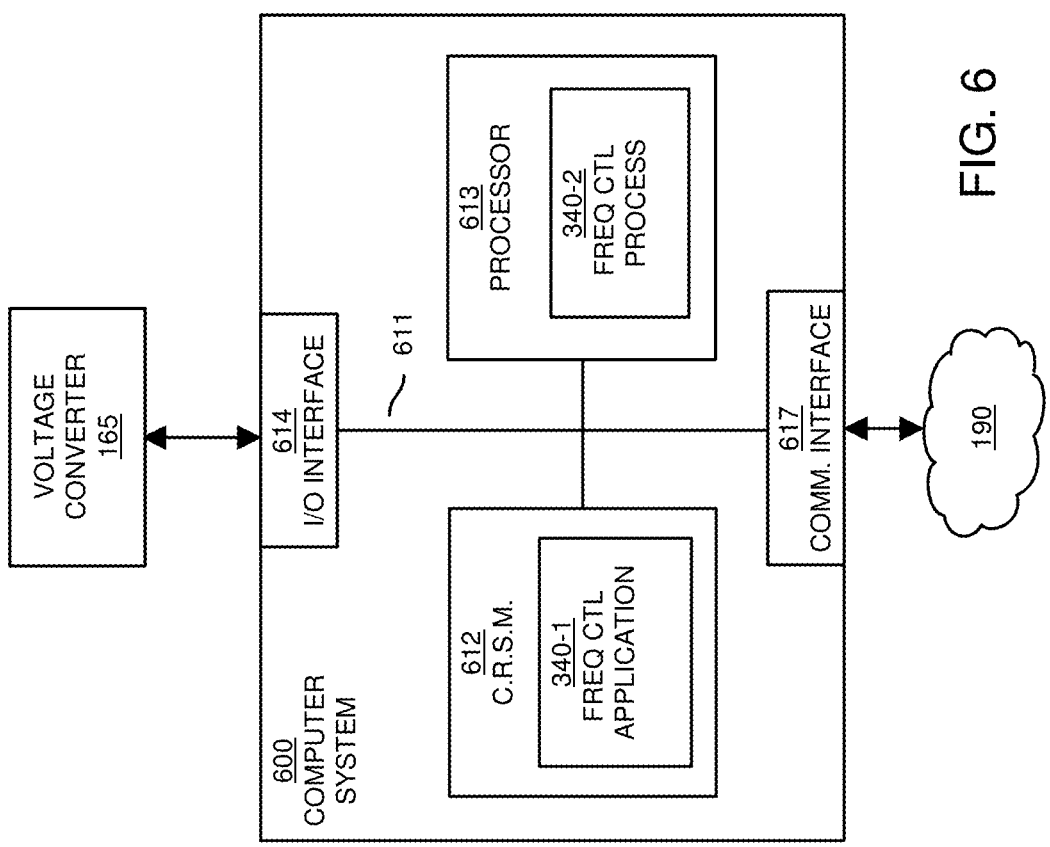
FIG. 6 is an example diagram illustrating computer processor hardware and related software instructions that execute methods according to embodiments herein.

FIG. 6 is an example block diagram of a computer device for implementing any of the operations as discussed herein according to embodiments herein.

As shown, computer system 600 (such as implemented by any of one or more resources such as controller 140, current monitor 150, signal generator 155, frequency selector 141, frequency controller 340, etc.) of the present example includes an interconnect 611 that couples computer readable storage media 612 such as a non-transitory type of media (or hardware storage media) in which digital information can be stored and retrieved, a processor 613 (e.g., computer processor hardware such as one or more processor devices), I/O interface 614, and a communications interface 617.

I/O interface 614 provides connectivity to any suitable circuitry such as one or more voltage converters 165.

Computer readable storage medium 612 can be any hardware storage resource or device such as memory, optical storage, hard drive, floppy disk, etc. In one embodiment, the computer readable storage medium 612 stores instructions and/or data used by the frequency controller application 340-1 to perform any of the operations as described herein.

Further in this example embodiment, communications interface 617 enables the computer system 600 and processor 613 to communicate over a resource such as network 190 to retrieve information from remote sources and communicate with other computers.

As shown, computer readable storage media 612 is encoded with frequency control application 340-1 (e.g., software, firmware, etc.) executed by processor 613. Frequency control application 340-1 can be configured to include instructions to implement any of the operations as discussed herein.

During operation of one embodiment, processor 613 accesses computer readable storage media 612 via the use of interconnect 611 in order to launch, run, execute, interpret or otherwise perform the instructions in frequency control application 340-1 stored on computer readable storage medium 612.

Execution of the frequency control application 340-1 produces processing functionality such as frequency control process 340-2 in processor 613. In other words, the frequency control process 340-2 associated with processor 613 represents one or more aspects of executing frequency control application 340-1 within or upon the processor 613 in the computer system 600.

In accordance with different embodiments, note that computer system 600 can be a micro-controller device, logic, hardware processor, hybrid analog/digital circuitry, etc., configured to control a power supply and perform any of the operations as described herein.

Functionality supported by the different resources will now be discussed via flowchart in FIG. 7. Note that the steps in the flowcharts below can be executed in any suitable order.

Figure 7:
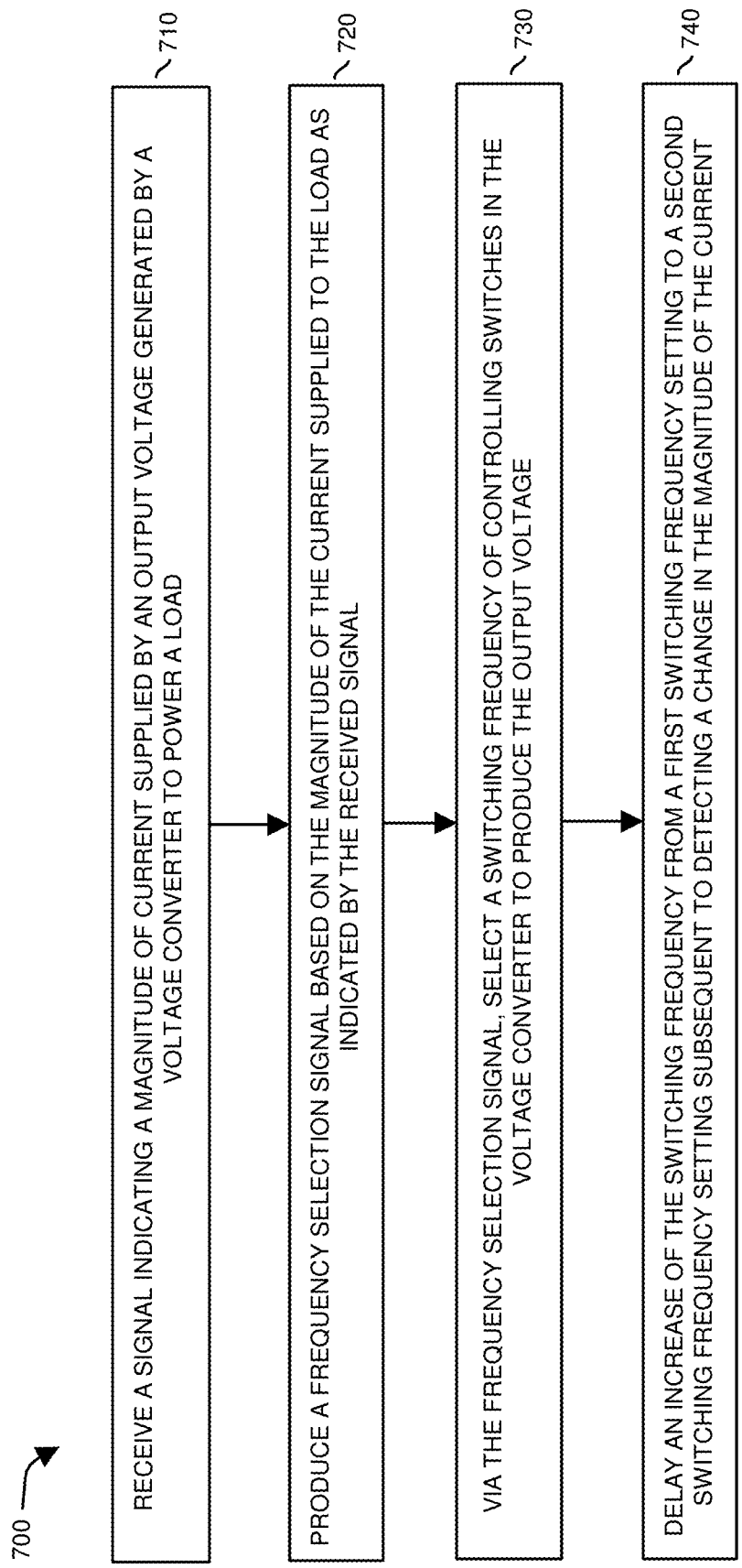
FIG. 7 is an example diagram illustrating a method according to embodiments herein.

FIG. 7 is an example diagram illustrating a method of controlling a power converter according to embodiments herein.

In processing operation 710, the frequency controller 340 receives a signal 152 indicating a magnitude of current 122 supplied by an output voltage 123 generated by a voltage converter 165 to power a load 118.

In processing operation 720, the frequency controller 340 produces a frequency selection signal 147 based on the magnitude of the current 122 supplied to the load 118 as indicated by the received signal 152.

In processing operation 730, via the frequency selection signal 147, the frequency controller 340 selects a switching frequency FSW of controlling switches 125 in the voltage converter 165 to produce the output voltage 123.

In processing operation 740, the frequency controller 340 delays increasing the switching frequency FW from a first switching frequency setting FW1 to a second switching frequency setting FSW2 subsequent to detecting a change in the magnitude of the current 122.

FIG. 8 is an example diagram illustrating assembly of a power converter circuit on a circuit board according to embodiments herein.

In this example embodiment, assembler 840 receives a substrate 810 (such as a circuit board).

The assembler 840 affixes (couples) the controller 140 and voltage converter 165 (and corresponding components associated with the power converter 135) to the substrate 810. The fabricator 840 also affixes the frequency controller 340 and corresponding components (monitor 150, selection signal generator 155, frequency selector 141) to the substrate 810.

Via circuit paths 820 (such as one or more traces, electrical conductors, cables, wires, etc.), the assembler 840 couples the frequency controller 340 to the power converter 135.

Via circuit paths 821 (such as one or more traces, electrical conductors, cables, wires, etc.), the assembler 840 couples the controller 140 to the voltage converter 165. Note that components such as the controller 140, voltage converter 165, and corresponding components such as frequency controller 340, etc., associated with the power converter 135 can be affixed or coupled to the substrate 810 in any suitable manner. For example, one or more of the components in power supply 100 can be soldered to the substrate, inserted into sockets disposed on the substrate 810, etc.

Note further that the substrate 810 is optional. Circuit paths 820, 821, 822, etc., may be disposed in cables providing connectivity between the power converter 135 and the load 118.

In one nonlimiting example embodiment, the dynamic load 118 is disposed on its own substrate independent of substrate 810; the substrate of the dynamic load 118 is directly or indirectly connected to the substrate 810. The controller 140 or any portion of the power converter 135 can be disposed on a standalone smaller board plugged into a socket of the substrate 810.

In further example embodiments, via one or more circuit paths 822 (such as one or more traces, cables, connectors, wires, conductors, electrically conductive paths, etc.), the assembler 840 couples the voltage converter 165 to the load 118. In one embodiment, the circuit path 822 conveys the output voltage 123 (and output current 122) generated from the voltage converter 165 to the load 118.

Accordingly, embodiments herein include a system comprising: a substrate 810 (such as a circuit board, standalone board, mother board, standalone board destined to be coupled to a mother board, host, etc.); a voltage converter 165 including corresponding components as described herein; and a dynamic load 118. As previously discussed, the dynamic load 118 is powered based on conveyance of output voltage 123 and corresponding current 122 conveyed over one or more circuit paths 822 from the voltage converter 165 to the dynamic load 118.

Note that the dynamic load 118 can be any suitable circuit or hardware such as one or more CPUs (Central Processing Units), GPUs (Graphics Processing Unit) and ASICs (Application Specific Integrated Circuits such those including one or more Artificial Intelligence Accelerators), which can be located on the substrate 810 or disposed at a remote location.

Note again that techniques herein are well suited for use in circuit applications such as those that implement power conversion. However, it should be noted that embodiments herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

The invention claimed is:

1. An apparatus comprising:
an input operative to receive a first signal indicating a magnitude of current supplied by an output voltage of a voltage converter to a load;
a signal generator operative to produce a second signal, the second signal being a frequency selection signal generated based on the magnitude of the current supplied to the load as indicated by the received first signal;
a frequency selector operative to, based on a setting of the second signal, select a switching frequency of controlling switches in the voltage converter to produce the output voltage;
a controller operative to control the switches via the selected switching frequency, control of the switches via the selected switching frequency including preventing the magnitude of current from exceeding a current threshold level; and
wherein the controller is further operative to switchover from operating the switches at a first switching frequency to operating the switches at the selected switching frequency in response to a transient condition in which the magnitude of the current reaches the current threshold level multiple times.

2. The apparatus as in claim 1, wherein the current threshold level is a peak current threshold limit; and
wherein the signal generator includes a comparator operative to compare the first signal to the peak current threshold limit.

3. The apparatus as in claim 2 further comprising:
the controller further operative to modify states of controlling the switches based on the magnitude of current;
wherein the switches include high side switch circuitry and low side switch circuitry, the switches controlled to control the magnitude of the current supplied to the load; and wherein the modified states of controlling the switches include deactivation of the high side switch circuitry in the voltage converter in response to detecting that the first signal equals the peak current threshold limit.

4. The apparatus as in claim 1, wherein the frequency selector is operative to set the switching frequency to a first frequency setting prior to detecting a change in the magnitude of the current; and
wherein the frequency selector is operative to delay adjustment of the switching frequency to a second frequency setting after detecting the change in the magnitude of the current.

5. The apparatus as in claim 4, wherein a magnitude of the output voltage changes at a first rate during the delay; and
wherein the magnitude of the output voltage changes at a second rate in response to selection of the second switching frequency.

6. The apparatus as in claim 1, wherein the frequency selector is operative to set the switching frequency to a first setting prior to detecting a change in the magnitude of the current; and
wherein the frequency selector is operative to set the switching frequency to the first setting in a first window of time between a first time instant of detecting the change in the magnitude of the current and a second time instant of detecting a trigger event.

7. The apparatus as in claim 6, wherein the frequency selector is operative to set the switching frequency to a second setting in a second window of time subsequent to the first window of time, the second switching frequency being greater than the first switching frequency.

8. The apparatus as in claim 1, wherein the frequency selector is operative to delay increasing the switching frequency from the first switching frequency setting to the selected switching frequency setting subsequent to detecting a change in the magnitude of the current.

9. The apparatus as in claim 8 further comprising:
a controller operative to control switching of the switches to convert an input voltage into the output voltage based on the selected switching frequency.

10. A system comprising:
a circuit substrate;
the apparatus of claim 1, the apparatus coupled to the circuit substrate; and
wherein the load is coupled to the substrate.

11. A method comprising:
receiving a circuit substrate; and
coupling the apparatus of claim 1 to the circuit substrate.

12. The apparatus as in claim 1, wherein the frequency selector is operative to increase the switching frequency of controlling the switches in the voltage converter in response to a detected condition in which the magnitude of the current equals the current threshold level.

13. The apparatus as in claim 1, wherein the selected switching frequency is a second switching frequency;
wherein the controller is operative to apply the first switching frequency to the switches during a first operating condition in which the magnitude of the current never reaches the current threshold level; and
wherein the controller is operative to apply the second switching frequency to the switches during a second operating condition in which the magnitude of the current reaches the current threshold level.

14. The apparatus as in claim 13, wherein control of the switches via the first switching frequency provides a more efficient operation of the voltage converter converting an input voltage into the output voltage than control of the switches via the second switching frequency.

15. The apparatus as in claim 1, wherein the selected switching frequency is a second switching frequency; and
wherein operation of the switches at the second switching frequency increases an average magnitude of the current supplied to the load with respect to prior operation of the switches at a first switching frequency, the first switching frequency less than the second switching frequency.

16. The apparatus as in claim 1, wherein operation of the switches at the selected switching frequency prevents a magnitude of the output voltage from dropping below an output voltage threshold level.

17. The apparatus as in claim 16, wherein a magnitude of the selected switching frequency is greater than a magnitude of the first switching frequency.

18. The apparatus as in claim 1, wherein the switchover from operating the switches at the first switching frequency to operating the switches at the selected switching frequency is operative to reduce a rate at which a magnitude of the output voltage decreases over time.

19. The apparatus as in claim 1, wherein the current threshold level is a peak current threshold limit; and
wherein the magnitude of the current reaches the peak current threshold limit during a transient condition in which the magnitude of the current supplied to the load increases over time.

20. An apparatus comprising:
an input operative to receive a first signal indicating a magnitude of current supplied an output voltage of a voltage converter to a load;
a signal generator operative to produce a second signal, the second signal being a frequency selection signal generated based on the magnitude of the current supplied to the load as indicated by the received first signal;
a frequency selector operative to, based on a setting of the second signal, select a switching frequency of controlling switches in the voltage converter to produce the output voltage;
a controller operative to control the switches via the selected switching frequency, control of the switches via the selected switching frequency including preventing the magnitude of current from exceeding a current threshold level;
wherein the current threshold level is a peak current threshold limit;
wherein the signal generator includes a comparator operative to compare the first signal to the peak current threshold limit; and
wherein the frequency selector is operative to increase the switching frequency of controlling the switches to the selected switching frequency in response to detecting that the magnitude of the current equals the peak current threshold limit for multiple control cycles of controlling the switches.

21. An apparatus comprising:
an input operative to receive a signal indicating a magnitude of current supplied by an output voltage of a voltage converter to a load;
a signal generator operative to produce a frequency selection signal based on the magnitude of the current supplied to the load as indicated by the received signal;

a frequency selector operative to, via the frequency selection signal, select a switching frequency of controlling switches in the voltage converter to produce the output voltage; and wherein the frequency selector is operative to increase the switching frequency of controlling the switches in the voltage converter to the selected switching frequency in response to a detected condition in which the magnitude of the current supplied to the load reaches a current limit value for a predetermined number of control cycles of controlling the switches.

22. An apparatus comprising:

an input operative to receive a first signal indicating a magnitude of current supplied by an output voltage of a voltage converter to a load;

a signal generator operative to produce a second signal, the second signal being a frequency selection signal generated based on the magnitude of the current supplied to the load as indicated by the received first signal;

a frequency selector operative to, based on a setting of the second signal, select a switching frequency of controlling switches in the voltage converter to produce the output voltage;

a controller operative to control the switches via the selected switching frequency, control of the switches via the selected switching frequency including preventing the magnitude of current from exceeding a current threshold level;

wherein the frequency selector is operative to set the switching frequency to a first setting prior to detecting a change in the magnitude of the current;

wherein the frequency selector is operative to set the switching frequency to the first setting in a first window of time between a first time instant of detecting the change in the magnitude of the current and a second time instant of detecting a trigger event; and wherein the trigger event is a condition in which the magnitude of the current is equal to a peak current limit value for multiple control cycles of monitoring the magnitude of current in the first window of time.

23. A method comprising:

receiving a first signal indicating a magnitude of current supplied by an output voltage generated by a voltage converter to power a load;

producing a second signal, the second signal being a frequency selection signal derived based on the magnitude of the current supplied to the load as indicated by the received first signal; and via the second signal, selecting a switching frequency of controlling switches in the voltage converter to produce the output voltage;

wherein selecting the switching frequency includes: increasing the switching frequency of controlling the switches in the voltage converter in response to a detected condition in which the magnitude of the current equals a current limit value for predetermined number of control cycles of controlling the switches.

24. The method as in claim 23 further comprising:
via a comparator, comparing the first signal to a peak current threshold value.

25. The method as in claim 24 further comprising:
via a switch controller, adjusting states of controlling the switches in response to detecting that the first signal equals the peak current threshold value.

26. The method as in claim 23 further comprising:
setting the switching frequency to a first frequency setting prior to detecting a change in the magnitude of the current; and delaying adjustment of the switching frequency to a second frequency setting after detecting the change in the magnitude of the current.

27. The method as in claim 26, wherein a magnitude of the output voltage changes at a first rate during the delay; and wherein the magnitude of the output voltage changes at a second rate in response to selection of the second switching frequency.

28. The method as in claim 23 further comprising:
setting the switching frequency to a first setting prior to detecting a change in the magnitude of the current; and setting the switching frequency to the first setting in a first window of time between a first time instant of detecting the change in the magnitude of the current and a second time instant of detecting a trigger event.

29. The method as in claim 28 further comprising:
setting the switching frequency to a second setting in a second window of time subsequent to the first window of time, the second setting being greater in frequency than the first setting.

30. The method as in claim 23, wherein selecting the switching frequency includes delay of increasing the switching frequency from a first switching frequency setting to a second switching frequency setting subsequent to detecting a change in the magnitude of the current.

31. The method as in claim 30 further comprising:
via switch controller, controlling switching of the switches to convert an input voltage into the output voltage based on the selected switching frequency.

32. A method comprising:

receiving a first signal indicating a magnitude of current supplied by an output voltage generated by a voltage converter to power a load;

producing a second signal, the second signal being a frequency selection signal derived based on the magnitude of the current supplied to the load as indicated by the received first signal;

via the second signal, selectin a switching frequency of controlling switches in the voltage converter to produce the output voltage;

via a comparator, comparing the first signal to a peak current threshold value; and wherein selecting the switching frequency includes: increasing the switching frequency of controlling the switches in response to detecting that the magnitude of the current equals the peak current threshold value for multiple control cycles of controlling the switches.

33. A method comprising;

receiving a first signal indicating a magnitude of current supplied by an output voltage generated by a voltage converter to power a load;

producing a second signal, the second signal being a frequency selection signal derived based on the magnitude of the current supplied to the load as indicated by the received first signal;

via the second signal, selecting a switching frequency of controlling switches in the voltage converter to produce the output voltage;

setting the switching frequency to a first setting prior to detecting a change in the magnitude of the current;

setting the switching frequency to the first setting in a first window of time between a first time instant of detecting the change in the magnitude of the current and a second time instant of detecting a trigger event; and wherein detecting the trigger event includes detecting a condition in which the magnitude of the current is equal to a peak current limit value for multiple control cycles of monitoring the magnitude of current in the first window of time.

34. An apparatus comprising:

an input operative to receive a first signal indicating a magnitude of current supplied by an output voltage of a voltage converter to a load;

a signal generator operative to produce a second signal, the second signal being a frequency selection signal generated based on the magnitude of the current supplied to the load as indicated by the received first signal;

a frequency selector operative to, based on a setting of the second signal, select a switching frequency of controlling switches in the voltage converter to produce the output voltage;

a controller operative to control the switches via the selected switching frequency, control of the switches via the selected switching frequency including preventing the magnitude of current from exceeding a current threshold level;

wherein the controller is further operative to switchover from operating the switches at a first switching frequency to operating the switches at the selected switching frequency in response to detecting a condition in which the magnitude of the current equals the current threshold level, the selected switching frequency being higher than the first switching frequency; and wherein a transition of switching over from operating the switches at the first switching frequency to operating the switches at the selected switching frequency reduces a magnitude of ripple current associated with the current supplied to the load.

35. The apparatus as in claim 34, wherein an average magnitude of the current while operating the switches at the first switching frequency is a first average value; and wherein the average magnitude of the current while operating the switches at the selected first switching frequency is a second average value, the second average value being greater than the first average value.

* * * * *

UNITED STATES PATENT AND TRADEMARK OFFICE
CERTIFICATE OF CORRECTION

| | |
|---|---|
| PATENT NO. | : 11,689,103 B2 |
| APPLICATION NO. | : 17/212371 |
| DATED | : June 27, 2023 |
| INVENTOR(S) | : Zhiqing You and Tim Ng |

It is certified that error appears in the above-identified patent and that said Letters Patent is hereby corrected as shown below:

In the Claims

Claim 20, Line 3, replace "supplied" with --supplied by--
Claim 23, Line 16, replace "for" with --for a--
Claim 32, Line 9, replace "selectin" with --selecting--

Signed and Sealed this
Twenty-second Day of August, 2023

Katherine Kelly Vidal
*Director of the United States Patent and Trademark Office*